(12) United States Patent
Kamiura et al.

(10) Patent No.: US 6,288,413 B1
(45) Date of Patent: Sep. 11, 2001

(54) THIN FILM TRANSISTOR AND METHOD FOR PRODUCING SAME

(75) Inventors: Norihiko Kamiura; Yoshiki Ishizuka, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/285,391

(22) Filed: Apr. 2, 1999

(30) Foreign Application Priority Data

Apr. 3, 1998 (JP) ................................................ 10-091068

(51) Int. Cl.⁷ .......................... H01L 29/76; H01L 31/036; H01L 31/112; H01L 27/108; H01L 29/04
(52) U.S. Cl. ................. 257/66; 257/67; 257/68; 257/69; 257/70; 257/71; 257/72
(58) Field of Search .......................................... 257/66–72

(56) References Cited

U.S. PATENT DOCUMENTS

| | | | | |
|---|---|---|---|---|
| 5,495,119 | * | 2/1996 | Ikeuchi | 257/365 |
| 5,693,959 | * | 12/1997 | Inoue et al. | 257/66 |
| 5,767,530 | * | 6/1998 | Ha | 257/72 |
| 5,834,797 | * | 11/1998 | Yamanaka | 257/57 |

FOREIGN PATENT DOCUMENTS 10-79513   3/1998 (JP) .

* cited by examiner

*Primary Examiner*—Eddie Lee
*Assistant Examiner*—Jesse A Fenty
(74) *Attorney, Agent, or Firm*—Oblon, Spivak, McClelland, Maier & Neustadt, P.C.

(57) ABSTRACT

A thin film transistor includes: an insulating substrate; a semiconductor layer of a polycrystalline silicon formed on the insulating substrate; a gate insulator film formed so as to contact the semiconductor layer; a gate electrode formed so as to contact the gate insulator film; an active layer formed in a region of the semiconductor layer corresponding to the gate electrode; a first semiconductor region which is formed in the semiconductor layer outside of the active layer and which has an impurity concentration of higher than or equal to $1 \times 10^{18}$ cm$^{-3}$ and lower than $1 \times 10^{20}$ cm$^{-3}$; and a second semiconductor region which is formed in the semiconductor layer outside of the first semiconductor region and which has an impurity concentration of higher than that of the first semiconductor region, the second semiconductor region having the same conductive type as that of the first semiconductor region. Thus, it is possible to obtain a reliable thin film transistor having small OFF current.

18 Claims, 9 Drawing Sheets

THIN FILM TRANSISTOR AND METHOD FOR PRODUCING SAME

BACKGROUND OF THE INVENTION

1. Field of The Invention

The present invention relates generally to a thin film transistor and a method for producing the same. More specifically, the invention relates to a thin film transistor using a polycrystalline silicon produced at a low temperature.

2. Related Background Art

In recent years, active matrix type liquid,crystal displays (which will be hereinafter referred to as liquid crystal displays) are used for personal computers, word processors and portable information terminals, since liquid display systems are thin and light, able to be driven at a low voltage and easily applied to color display systems.

Among these displays, liquid crystal displays using thin film transistors (which will be hereinafter referred to as TFTs) as switching elements for pixel parts have been actively studied and developed, since such liquid crystal displays have a high display quality and a low electric power consumption.

TFTs are generally classified, in view of materials of active layers, into amorphous silicon TFTs using an amorphous silicon as the material of an active layer, and polycrystalline silicon TFTs using a polycrystalline silicon as the material of an active layer.

There is an advantage in that polycrystalline silicon TFTs have mobility about 10 to 100 times as high as that of amorphous silicon TFTs. Therefore, polycrystalline silicon TFTs are most suitable for pixel switching elements. In recent years, polycrystalline silicon TFTs are also used as elements of peripheral driving circuits. As a result, so-called pixel part-driving circuit integrated liquid crystal displays, wherein TFTs for pixel parts and TFTs for peripheral driving circuits are simultaneously formed on the same substrate, are actively studied and developed.

However, since polycrystalline silicon TFTs have a higher process temperature (e.g., 800° C., such polycrystalline silicon TFTs will be hereinafter referred to as high-temperature polycrystalline silicon TFT) than that of amorphous silicon TFTs, it is required to use an expensive, heat resisting glass substrate as an insulating substrate.

For that reason, low-temperature polycrystalline silicon TFTs having a low process temperature (e.g., 300° C.~600° C.) are widely noticed so that cheaper glass substrates can be used.

However, there is a problem in that low-temperature polycrystalline silicon TFTs have a higher value of resistance of a source-drain region of a contact layer than that of high-temperature polycrystalline silicon TFTs. Because the carrier concentration being in proportion to conductivity is low since the impurity activation rate for the source-drain region in a low temperature process is lower than that in a high temperature process. If the value of resistance of the source-drain region of the contact layer is high, the series resistor component increases, so that it is not possible to sufficiently obtain the ON current of TFTs, thereby deteriorating the picture quality.

In addition, since polycrystalline silicon TFTs have higher mobility than that of amorphous silicon TFTs, the scale down of TFTs can be achieved, whereas it is required to relieve the field intensity of a high field region generated in the vicinity of the drain of the active layer. If the field intensity in the vicinity of the drain is high, there are problems in that the impact ionization phenomenon and the carrier injection into the gate insulator film are caused to shift the gate threshold voltage (Vth) of the TFTs to deteriorate the reliability of the TFTS. There is particularly no problem if polycrystalline silicon TFTs are used for peripheral driving circuits, whereas there is a problem in that the picture quality deteriorates if polycrystalline silicon TFTs are used for pixel switching elements.

Therefore, in order to eliminate the aforementioned disadvantages, it is considered that polycrystalline silicon TFTs for pixel parts use a lightly doped drain (which will be hereinafter referred to as "LDD" or "n$^-$") structure, and n$^+$-contact structure wherein a high concentration impurity is added to reduce the resistance of a source-drain contact layer.

FIGS. 7A through 7E are sectional views showing a process for producing an array substrate for a liquid crystal display, which uses conventional high-temperature polycrystalline silicon TFTs as switching elements for pixel parts, the high-temperature polycrystalline silicon TFTs being produced by the thermal annealing at a temperature of higher than or equal to 800° C. to have a LDD structure and an n$^+$-contact layer. In this liquid crystal display, the pixel parts and the peripheral driving circuit parts are formed on the same substrate. These drawings show only a CMOS transistor as the element of the peripheral driving circuit. The conductive type of the polycrystalline silicon TFTs used as the switching elements for the pixel parts is an n-type channel.

First, as shown in FIG. 7A, after a polycrystalline silicon film is formed on a transparent insulating substrate 81, the polycrystalline silicon film is patterned to form active layers 82a through 82c. Then, after a gate insulator film 83 is formed on the whole surface, gate electrodes 84a through 84c are formed on the gate insulator film 83.

Then, as shown in FIG. 7B, while a CMOS region for a peripheral driving circuit is covered with a resist 85, phosphorus (P) is ion-implanted into a TFT region for a pixel part. As a result, an n$^-$type source-drain region (which will be hereinafter referred to as a low-concentration n$^-$type source-drain region) 86, which has a relatively low impurity concentration (e.g., less than $1\times10^{18}$ cm$^{-3}$), is formed so as to be self-aligned to the gate electrode 84c.

Then, as shown in FIG. 7C, after the resist 85 is removed, P is ion-implanted while the p-type TFT region of the CMOS region for the peripheral driving circuit, the gate electrode 84c for the pixel part and the low-concentration n-type source-drain region 86 in the vicinity thereof are covered with a resist 87. As a result, n$^+$-type source-drain regions (which will be hereinafter referred to as high-concentration n$^+$-type source-drain regions) 88a and 88c, which have a high impurity concentration (e.g., $1\times10^{20}$ cm$^{-3}$), are formed. In order to reduce the resistance of the contact layer 88c, the impurity concentration of the regions 88a and 88c in a low temperature process must be higher than that in a high temperature process.

Then, as shown in FIG. 7D, after the resist 87 is removed, boron (B) is ion-implanted into the p-type TFT region of the CMOS region for the driving circuit part while the n-type TFT region of the CMOS region for the peripheral driving circuit and the TFT region for the pixel part are covered with a resist 89. As a result, a p$^+$-type source-drain region 88b having a relatively high impurity concentration (e.g., $10^{19}$~$10^{20}$ cm$^{-3}$) is formed.

Finally, as shown in FIG. 7E, after the resist 89 is removed, the thermal activation of impurity (e.g., a high temperature thermal annealing at a temperature of higher than or equal to 800° C.), the preparation of an interlayer insulator film 90 and the preparation of a source-drain electrode 91 are subsequently carried out to accomplish the basic structures of each of TFTs. Thereafter, pixel electrodes (not shown) and so forth are formed to accomplish the basic structure of the array substrate.

However, in such a TFT having the LDD structure and the $n^+$-contact structure, there are the following problems. That is, the low-concentration $n^-$-type source-drain region 86 and the high-concentration $n^+$type source-drain regions 88$a$ and 88$c$ have a low impurity activation rate, so that the junction to the $n^-$ region or the n-type channel is bad. Therefore, there is a problem in that a leak current (which will be hereinafter referred to as an OFF current for a TFT), which flows through the TFT when it is turned OFF, is large.

SUMMARY OF THE INVENTION

It is therefore an object of the present invention to eliminate the aforementioned problems and to provide a reliable thin film transistor having a lower OFF current than that of conventional thin film transistors, and a method for producing the same.

In order to accomplish the aforementioned and other objects, according to one aspect of the present invention, a thin film transistor comprises: an insulating substrate; a semiconductor layer of a polycrystalline silicon formed on the insulating substrate; a gate insulator film formed so as to contact the semiconductor layer; a gate electrode formed so as to contact the gate insulator film ; an active layer formed in a region of the semiconductor layer corresponding to the gate electrode; a first semiconductor region which is formed in the semiconductor layer outside of the active layer and which has an impurity concentration of higher than or equal to $1\times10^{18}$ cm$^{-3}$ and lower than $1\times10^{20}$ cm$^{-3}$; and a second semiconductor region which is formed in the semiconductor layer outside of the first semiconductor region and which has an impurity concentration of higher than that of the first semiconductor region, the second semiconductor region having the same conductive type as that of the first semiconductor region.

The activation rate of the first semiconductor region is preferably 40% or more. The first semiconductor region may be formed between the second semiconductor region arid the insulating substrate. The impurity concentration of the second semiconductor region is preferably higher than or equal to $1\times10^{20}$ cm$^{-3}$ and lower than or equal to $1\times10^{22}$ cm$^{-3}$. The boundary surface between the active layer and the first semiconductor region may be offset from an end of the gate electrode. The width of the first semiconductor region is preferably more than or equal to 0.2 μm and less than or equal to 2 μm. The thickness of the active layer is preferably in the range of from 10 to 100 nm.

According to another aspect of the present invention, a thin film transistor comprises: an insulating substrate; a semiconductor layer of a polycrystalline silicon formed on the insulating substrate; a gate insulator film formed so as to contact the semiconductor layer; a gate electrode formed so as to contact the gate insulator film ; an active layer formed in a region of the semiconductor layer corresponding to the gate electrode; a first semiconductor region which is formed in the semiconductor layer outside of the active layer and which has an impurity concentration of higher than or equal to $1\times10^{18}$ cm$^{-3}$ and lower than $1\times10^{20}$ cm$^{-3}$; a second semiconductor region which is formed in the semiconductor layer outside of the first semiconductor region and which has an impurity concentration of higher than that of the first semiconductor region, the second semiconductor region having the same conductive type as that of the first semiconductor region; and a third semiconductor region which is formed in the semiconductor layer between the active layer and the first semiconductor region and which has an impurity concentration of lower than that of the first semiconductor region, the third semiconductor region having the same conductive type as that of the first semiconductor region.

The activation rate of the first semiconductor region is preferably 40% or more. The first semiconductor region may be formed between the second semiconductor region and the insulating substrate. The impurity concentration of the second semiconductor region is preferably higher than or equal to $1\times10^{20}$ cm$^{-3}$ and lower than or equal to $1\times10^{22}$ cm$^{-3}$, and the impurity concentration of the third semiconductor region is preferably higher than or equal to $1\times10^{16}$ cm$^{-3}$ and lower than $1\times10^{18}$ cm$^{-3}$. The semiconductor layer may be formed between the insulating substrate and the gate insulating film . The gate electrode may be formed between the insulating substrate and the gate insulating film. The width of the first semiconductor region is preferably more than or equal to 0.2 μm and less than or equal to 2 μm. The thickness of the active layer is preferably in the range of from 10 to 100 nm.

According to a further aspect of the present invention, a method for producing a thin film transistor, comprises the steps of: forming a semiconductor layer of a polycrystalline silicon at a temperature of lower than or equal to 600° C. so as to contact an insulating substrate; forming a gate insulator film so as to contact the semiconductor layer; forming a gate electrode so as to contact the gate insulator film ; forming a first semiconductor region, which has an impurity concentration of higher than or equal to $1\times10^{18}$ cm$^{-3}$ and lower than $1\times10^{20}$ cm$^{-3}$, in the semiconductor layer outside of the gate electrode; and forming a second semiconductor region, which has an impurity concentration of higher than that of the first semiconductor region and which has the same conductive type as that of the first semiconductor region, the semiconductor layer outside of the first semiconductor region.

This method may further comprise a step of forming a third semiconductor region, which has an impurity concentration of lower than that of the first semiconductor region and which has the same conductive type as that of the first semiconductor region, between a region of the semiconductor layer corresponding to the gate electrode and the first semiconductor region.

The method may further comprise a step of removing the gate insulator film on a region of the semiconductor layer, on which the second semiconductor region is formed, before forming the second semiconductor region.

According to the present invention, in a low-temperature polycrystalline silicon the first semiconductor region serving as an intermediate concentration portion is arranged between the third semiconductor region serving as a low concentration portion and the second semiconductor region serving as a high concentration portion. Alternatively, the intermediate concentration portion is arranged between the channel region (the active layer) and the high concentration portion. Thus, it is possible to obtain a good junction between the low concentration portion and the high concentration portion and between the channel and the high concentration portion, so that it is possible to form a potential barrier sufficient to minority carriers in the junction to effectively block the minority carriers. Therefore, it is possible to provide a reliable low-temperature polycrystalline silicon TFT having a small OFF current.

BRIEF DESCRIPTION OF THE DRAWINGS

The present invention will be understood, more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below.

(First Preferred Embodiment)

FIGS. 1A through 1F are sectional views showing a process for producing the first preferred embodiment of a TFT according to the present invention. In this preferred embodiment, the TFT is a coplanar type TFT.

Figure 1A:
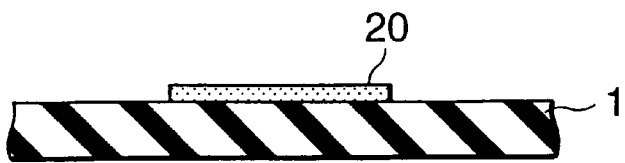
FIGS. 1A through 1F are sectional views showing the first preferred embodiment of a process for producing a TFT according to the present invention.

First, as shown in FIG. 1A, an intrinsic (an impurity concentration of $1\times10^{16}$ cm$^{-3}$ or less) polycrystalline silicon film 20 having a predetermined shape is formed on an insulating substrate 1 as a semiconductor active layer. The insulating substrate 1 is, e.g., a substrate of an insulating material, such as a glass, or a substrate coated with an insulating material. In this preferred embodiment, the thickness of the polycrystalline silicon film 20 of the TFT is, e.g., 50 nm, although it is generally in the range of from 10 nm to 100 nm. The methods for forming the polycrystalline silicon film 20 include, e.g., a method for forming a polycrystalline silicon film from an amorphous silicon film by the solid-phase growth, a method for forming a polycrystalline silicon film by crystallizing an amorphous silicon film by the laser annealing after the amorphous silicon film is formed by the plasma CVD method or the LPCVD method, and a method for directly forming a polycrystalline silicon film by the plasma CVD method using $SiH_4$, $SiF_4$, $H_2$ or the like as a raw material gas.

Figure 1B:
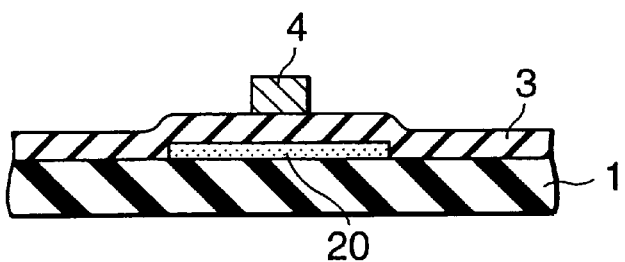

Then, as shown in FIG. 1B, after a gate insulator film 3 is formed on the whole surface, a gate electrode 4 is formed on the gate insulator film 3. For example, a silicon oxide film or a silicon nitride film is used as the gate insulator film 3, and the thickness thereof is 100 nm. For example, the CVD method, the plasma CVD method or the ECR-CVD method is used as the method for depositing the gate insulator film 3. The gate insulator film 3 may be formed by the thermal oxidation of a polycrystalline silicon film.

Figure 1C:
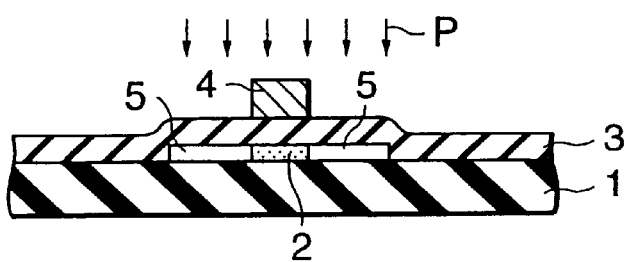
Figure 2A:
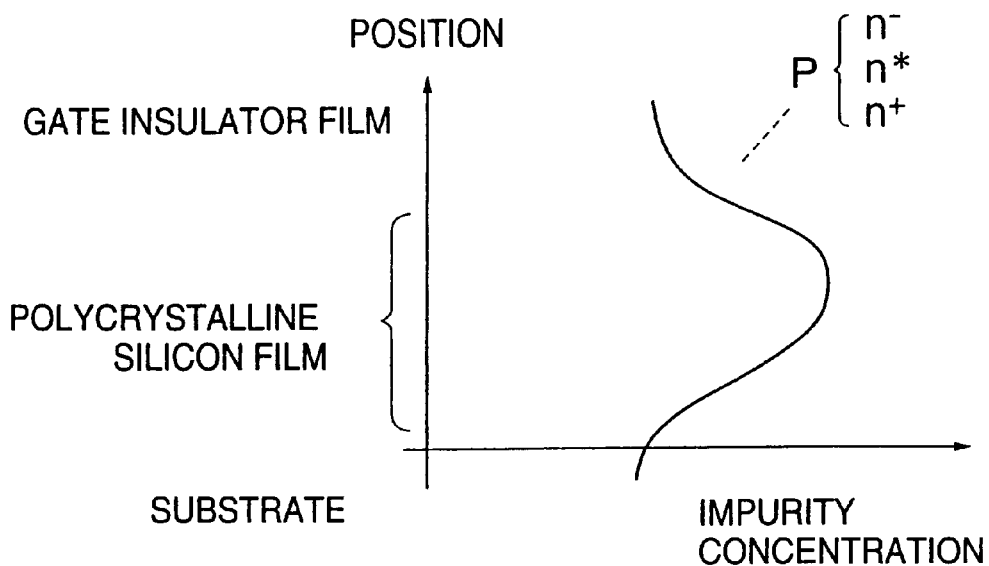
FIG. 2A is a diagram showing an impurity concentration profile of an n-type impurity (phosphorus) in a TFT in the first preferred embodiment.

Then, as shown in FIG. 1C, phosphorus (P) serving as an n-type impurity is ion-implanted into the polycrystalline silicon film 20 using the gate electrode 4 as a mask to form an active layer 2 and two low-concentration n$^-$-type source-drain regions 5. The region sandwiched between the n$^-$-type source-drain regions 5 serves as the active layer 2. The n$^-$-type source-drain regions 5 have an impurity concentration profile having a substantially flat distribution, which has an average impurity concentration of $5\times10^{17}$ cm$^{-3}$ and a maximum value in the vicinity of the center in the depth direction as shown in FIG. 2A.

The reason why the expression "source-drain region" is used is that a source is not distinguished from a drain unless a TFT is actually used, and the source may be replaced from the drain during the TFT is used.

Figure 1D:
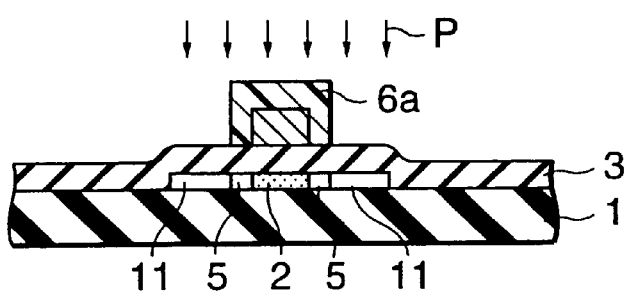

Then, as shown in FIG. 1D, while the gate electrode 4 and the n$^-$-source-drain regions 5 in the vicinity thereof are covered with a photo-resist 6a, phosphorus (P) serving as an n-type impurity is ion-implanted into the active layer 2 to form two intermediate-concentration n*-type source-drain regions 11. The n*-type source-drain regions 11 have an impurity concentration profile having a substantially flat distribution, which has an average impurity concentration of $1\times10^{19}$ cm$^{-3}$ and a maximum value in the vicinity of the center in the depth direction as shown in FIG. 2A.

Figure 1E:
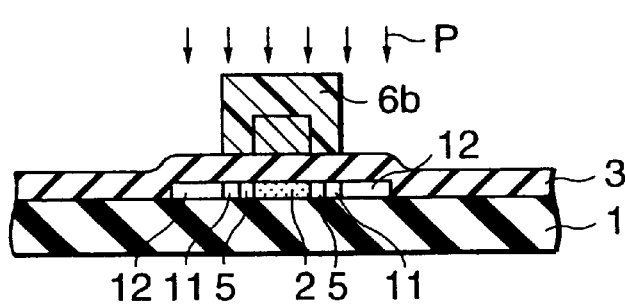

Then, the resist 6a is removed. Thereafter, as shown in FIG. 1E, while the gate electrode 4, the n$^-$-source-drain regions 5 in the vicinity thereof, and the n*-type source-drain regions 11 in the vicinity thereof are covered with a photo-resist 6b, phosphorus (P) serving as an n-type impurity is ion-implanted into the polycrystalline silicon film 20 to form two high-concentration n$^+$-type source-drain regions 12. The n$^+$-type source-drain regions 12 have an impurity concentration profile having a substantially flat distribution, which has an average impurity concentration of $1\times10^{20}$ cm$^{-3}$ and a maximum value in the vicinity of the center in the depth direction as shown in FIG. 2A.

Figure 3A:
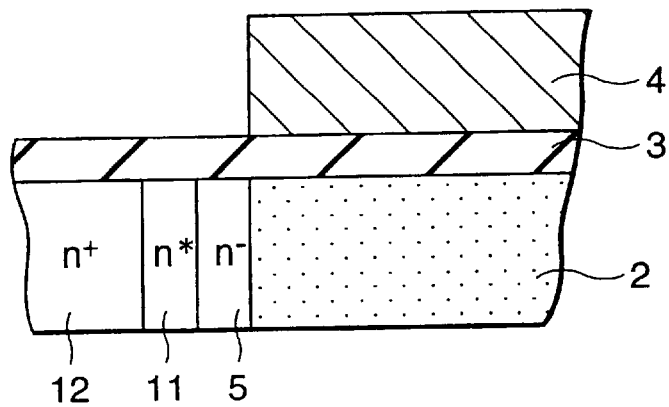
FIGS. 3A through 3C are enlarged views showing impurity regions in a TFT according to the present invention.

As a result, as shown in FIG. 3A, the low-concentration n$^-$-source-drain regions 5, the intermediate-concentration n*-type source-drain regions 11 and the high-concentration n$^+$-type source-drain regions 12 are sequentially formed on the outside of the active layer 2 viewed from the gate electrode 4.

Then, after the resist 6b is removed, the impurity (P) is activated by an energy beam, such as a laser light or an electron beam, (a laser annealing) and thermally activated at a low temperature of lower than or equal to 600° C. (a thermal annealing at a temperature in the range of from 300° C. to 600° C.). Since the laser annealing is completed in a short time, there is no problem in that the impurity concentration profile varies. The thermal annealing at a temperature of lower than or equal to 600° C. is the same. Moreover, even if an inexpensive glass substrate is used as the insulating substrate 1 to reduce costs, there is no problem in that the glass substrate is thermally damaged.

Figure 1F:
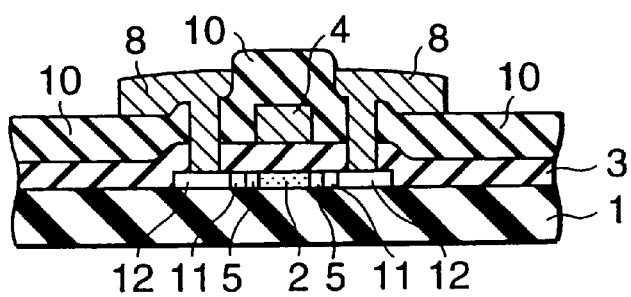

Then, as shown in FIG. 1F, after an interlayer insulator film 10 is formed on the whole surface, the gate insulator film 3 on the n⁻-source-drain regions 5 and the interlayer insulator film 10 are etched to form contact holes to the n⁺-type source-drain regions 12. Finally, after a conductive film is formed on the whole surface, the conductive film is patterned to form a source-drain electrode 8 to accomplish the basic structure of a coplanar type TFT.

The impurity concentration of the low-concentration source-drain regions 5 is preferably greater than or equal to $1 \times 10^{16}$ cm⁻³ and less than $1 \times 10^{18}$ cm⁻³, and the impurity concentration of the intermediate-concentration source-drain regions 11 is preferably greater than or equal to $1 \times 10^{18}$ cm⁻³ and less than $1 \times 10^{20}$ cm⁻³. In addition, the impurity concentration of the high-concentration source-drain regions 12 is preferably greater than or equal to $1 \times 10^{20}$ cm⁻³ and less than or equal to $1 \times 10^{22}$ cm⁻³. The resistance of the low-concentration impurity regions 5 must be increased to relieve the field in the vicinity of the drain. On the other hand, the contact resistance of the high-concentration impurity regions 12 to the source-drain electrode 8 must be reduced (to less than or equal to 1 kΩ).

The reasons why the impurity concentration of the intermediate-concentration source-drain regions 11 is preferably higher than or equal to $1 \times 10^{18}$ cm⁻³ and less than $1 \times 10^{20}$ cm⁻³ will be described below.

Figure 8:
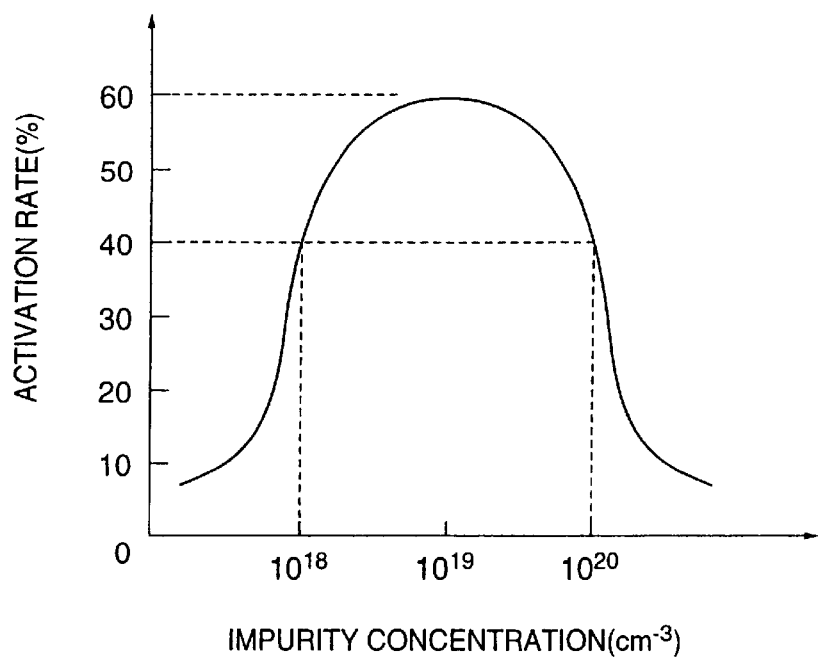
FIG. 8 is a graph showing the relationship between impurity concentrations and activation rates.

FIG. 8 is a characteristic graph showing the relationship between impurity concentrations and activation rates for phosphorus (P) when a polycrystalline silicon film having a thickness of 50 nm is activated at a low temperature of 600° C. without dope. This characteristic graph was first obtained by the inventors. The impurity concentration is multiplied by an activation rate to obtain a carrier concentration. The carrier concentration is measured by the measurement of positive holes, and the impurity concentration is measured by an analysis using a secondary-ion mass spectroscopy (SIMS). As shown in FIG. 8, when activation is carried out at a low temperature of 600° C., the activation rate is low in a region (a low concentration region) having an impurity concentration of less than $1 \times 10^{18}$ cm⁻³ and a region (a high concentration region) having an impurity concentration of greater than $1 \times 10^{20}$ cm⁻³. Furthermore, $1 \times 10^{20}$ cm⁻³ is excluded since the activation rate in the case of an impurity concentration of $1 \times 10^{20}$ cm⁻³ is not distinguished from the case where the impurity concentration of the high-concentration n⁺-type source-drain regions 12 is $1 \times 10^{20}$ cm⁻³, although the activation rate in the case of an impurity concentration of $1 \times 10^{20}$ cm⁻³ is the same as that in the case of an impurity concentration of $1 \times 10^{8}$ cm⁻³.

In general, impurities ion-implanted into a semiconductor are mostly arranged between lattices, so that the impurities do not serve as donors or acceptors as they are. Therefore, in order to rearrange the impurities to the lattice positions and electrically activate the impurities to restore the lattice defect caused by the implantation to the original crystal state, heat treatment (annealing) is carried out after the implantation. However, in the case of the ion implantation for forming a high concentration (n⁺) region, a polycrystalline silicon film is greatly damaged, so that the recovery of the crystal is not sufficient to allow activation to efficiently progress in a low temperature annealing at a temperature of lower than or equal to 600° C. unlike a high temperature annealing. In the case of the ion implantation for forming a low concentration (n⁻) region, the impurity concentration to be ion-implanted has substantially the same level as the trap concentration ($10^{16} \sim 10^{17}$ cm⁻³), which initially exists in the polycrystalline silicon film. Therefore, crystallinity is good although the apparent activation rate is decreased. Because crystal is sufficiently restored by a low temperature annealing since the damage to the film by the ion implantation is small.

As described above, only the n* regions have bad crystallinity. Therefore, similar to conventional cases, when the TFT is turned OFF, the potential barrier to minority carriers (positive holes in this case) is not sufficiently formed in the junction for connecting the channel in the active layer to the n⁺ region and in the junction for connecting the n region to the n⁺ region. Thus, the minority carriers can not be sufficiently inhibited, so that the OFF current of the TFT increases.

However, in this preferred embodiment, the n* region 11 having a good activation rate (40% or more), i.e., a good crystallinity, is provided between the n⁻ region 5 and the n⁺ region 12, so that it is possible to form a good junction between the n* region 11 and the n⁺ region 12 having a bad crystallinity. Thus, it is possible to form a potential barrier sufficient to the minority carriers in the junction when the TFT is turned OFF, so that it is possible to effectively inhibit the minority carriers and it is possible to reduce the OFF current.

Furthermore, it is not possible to prevent impurities of phosphorus from diffusing from the n⁺ region 12 unless the width of the intermediate-concentration impurity region 11 is 0.2 μm or more. In addition, the width is desirably 2 μm or less in order to reduce the resistance of the intermediate concentration impurity region 11.

According to this preferred embodiment, the activation rate of the intermediate-concentration n*-type source-drain region 11 is 40% or more, and the junction between the n* region 11 and the n⁺ region 12 has an efficient blocking function to the minority carriers, so that it is possible to provide a reliable low-temperature polycrystalline silicon having a small OFF current.

(Second Preferred Embodiment)

FIGS. 4A through 4F are sectional views showing a process for producing the second preferred embodiment of a TFT according to the present invention. In this preferred embodiment, the TFT is a coplanar type TFT.

Figure 4A:
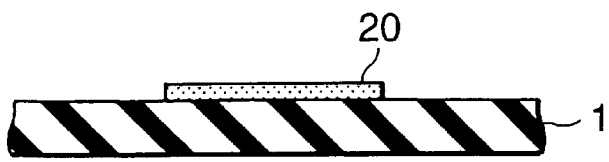
FIGS. 4A through 4F are sectional views showing the second preferred embodiment of a process for producing a TFT according to the present invention.

First, as shown in FIG. 4A, a polycrystalline silicon film 20 having a predetermined shape is formed on an insulating substrate 1 as an active layer. The material, forming method and thickness of the polycrystalline silicon film 20 are the same as those in the first preferred embodiment.

Figure 4B:
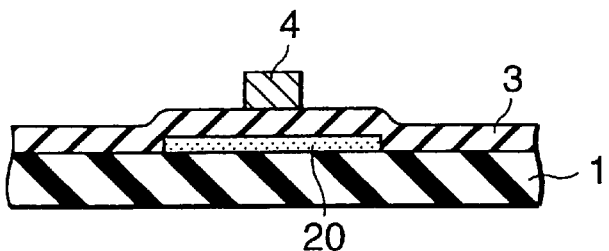

Then, as shown in FIG. 4B, after a gate insulator film 3 is formed on the whole surface, a gate electrode 4 is formed on the gate insulator film 3. The materials, forming methods and thicknesses of the gate insulator film 3 and the gate electrode 4 are the same as those in the first preferred embodiment.

Figure 4C:
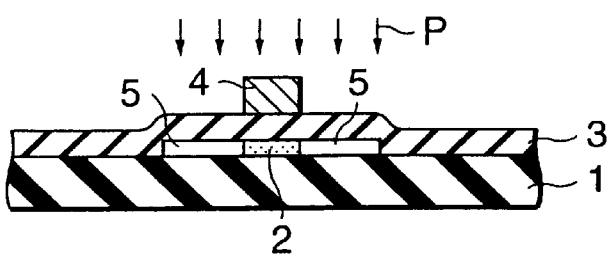

Then, as shown in FIG. 4C, phosphorus (P) serving as an n-type impurity is ion-implanted into the polycrystalline silicon film 20 using the gate electrode 4 as a mask to form two low-concentration n⁻-source-drain regions 5. The n⁻source-drain regions 5 have an impurity concentration profile having a substantially flat distribution, which has an average impurity concentration of $5 \times 10^{17}$ cm⁻³ and a maximum value in the vicinity of the center in the depth direction as shown in FIG. 2A.

Figure 4D:
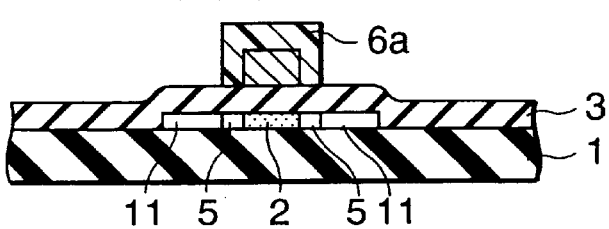

Then, as shown in FIG. 4D, while the gate electrode 4 and the n⁻-type source-drain regions 5 in the vicinity thereof are covered with a photo-resist 6a, phosphorus (P) serving as an n-type impurity is ion-implanted into the polycrystalline silicon film 20 to form two intermediate-concentration n*-type source-drain regions 11. The n* regions 11 have an impurity concentration profile having a substantially flat distribution, which has an average impurity concentration of $1 \times 10^{19}$ cm$^{-3}$ and a maximum value in the vicinity of the center in the depth direction as shown in FIG. 2A.

Figure 2B:
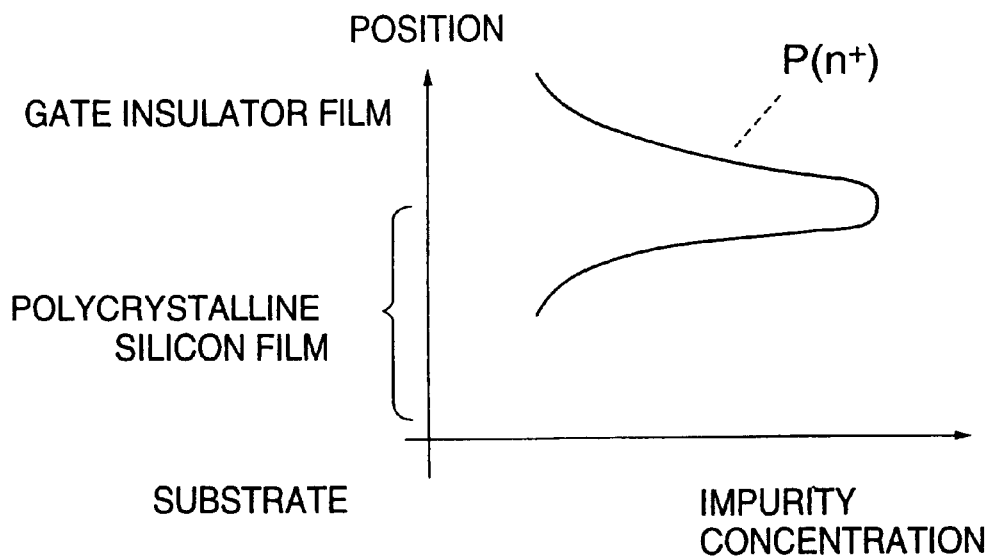
FIG. 2B is a diagram showing an impurity concentration profile of an intermediate concentration layer in a TFT in the second preferred embodiment.
Figure 4E:
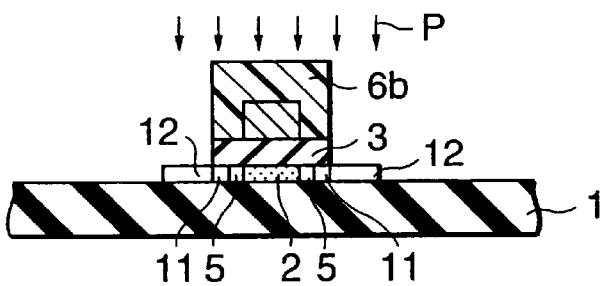

Then, after the resist 6a is removed, the gate insulator film is etched while the gate electrode 4, the n⁻-source-drain regions 5 in the vicinity thereof, and the n*-type source-drain regions 11 in the vicinity thereof are covered with a photoresist 6b as shown in FIG. 4E. Subsequently, after the resist 6b is removed, ion implantation is carried out while no insulator film is formed above an n⁺ region, which will be formed later. In this case, since it is possible to remove the loss due to the dopant absorbed into the insulator film, it is possible to shorten the processing time for ion implantation. For example, it is assumed that the average impurity concentration of an n⁺ region 12 to be formed is $1 \times 10^{20}$ cm$^{-3}$. In this case, since no insulator film is formed on the upper layer, the peak intensity for ion implantation exists in the vicinity of the surface as shown in FIG. 2B. Therefore, it is possible to form the high-concentration n⁺-type source-drain regions 12 only in the upper portion. Phosphorus (P) serving as an n-type impurity is ion-implanted into the polycrystalline silicon film 20 to form two n⁺-type source-drain regions 12 in the vicinity of the surface.

Figure 3B:
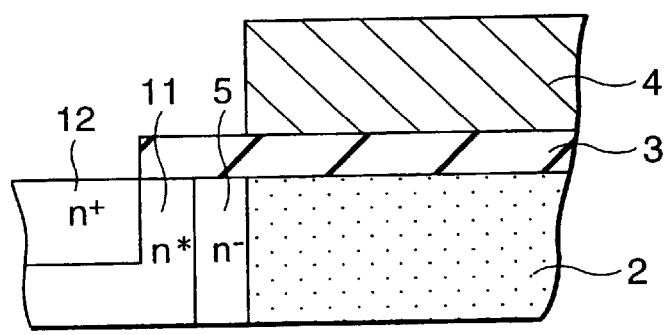

As a result, as shown in FIG. 3B, the low-concentration n⁻-source-drain regions 5 and the intermediate-concentration n*-type source-drain regions 11 are formed on the outside of the active layer 2 viewed from the gate. Moreover, on the outside thereof, the high-concentration n⁺-type source-drain regions 12 are formed in the upper layer, and the intermediate-concentration n*-type source-drain regions 11 are formed in the bottom.

Then, after the resist 6 is removed, the impurity (P) is activated by an energy beam, such as a laser light or an electron beam, (a laser annealing) or thermally activated at a low temperature of lower than or equal to 600° C. (a thermal annealing at a temperature of lower than or equal to 600° C.).

Figure 4F:
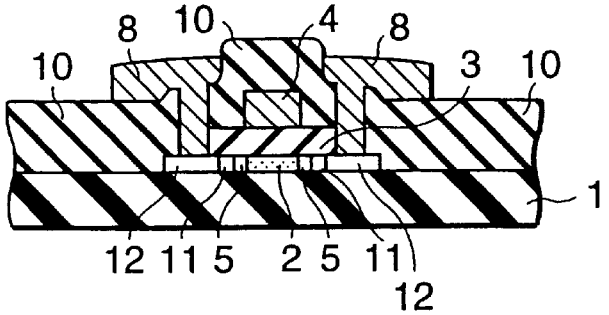

Then, as shown in FIG. 4F, after an interlayer insulator film 10 is formed on the whole surface, the gate insulator film 3 on the n⁺-type source-drain regions 12 and the interlayer insulator film 10 are etched to form contact holes to the n⁺-type source-drain regions 12. Finally, after a conductive film is formed on the whole surface, the conductive film is etched to form a source-drain electrode 8 to accomplish the basic structure of a coplanar type TFT.

In this preferred embodiment, it is possible to obtain the following advantages in addition to the same advantages as those in the preceding preferred embodiment.

That is, in this preferred embodiment, since the ion implantation into the n⁺ region 12 is carried out on a low acceleration condition (e.g., 10 KeV~30 KCV), the n-type impurity, such as phosphorus (P), is injected again into the gate insulator films on the n⁻ region 5 and n* region 11 (and the source-drain region of the p-type MOS (not shown)) at a low acceleration. This has a good influence on the characteristics of the elements. Since the ion implantation for forming the n⁻ region 5 and the n* region 11 is carried out at a high acceleration (e.g., 50 KeV or more), the gate insulator film 3 is greatly damaged. Thereafter, when the n⁺ region 12 is formed, the ion implantation into the gate insulator film 3 is carried out at a low acceleration, so that the injected dopant functions to relieve the damage to the gate insulator film 3. In addition, the oxide film (insulator film) formed in the low temperature process has a low concentration and is not a good film, unlike a thermal oxide. However, the injection of the dopant atom having an atomic radius, which is slightly different from that of Si, functions to reasonably terminate defects to improve the quality of the film. In this case, the ion implantation into the source-drain region below the gate insulator film 3 is hardly carried out. In a TFT, a portion in the vicinity of the end of the drain must have a high field intensity and a highest quality of film. In that sense, the improvement of the quality due to the implantation into the insulator film on the n⁻ region 5 and n* region 11 (and the source-drain region of the p-type MOS (not shown)) greatly serves to improve the characteristics thereof.

(Third Preferred Embodiment)

FIGS. 5A through 5E are sectional views showing a process for producing the third preferred embodiment of a TFT according to the present invention. In this preferred embodiment, the TFT is a coplanar type TFT. In this preferred embodiment, no n⁻ LDD region is provided, and an n* region 11 is offset from the end portion of a gate electrode 4 in place of the n⁻ LDD region.

Figure 5A:
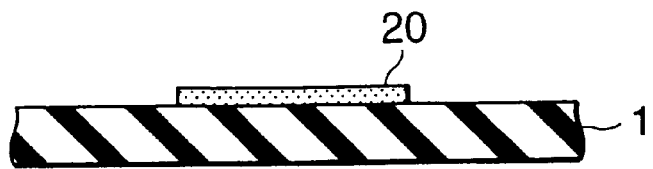
FIGS. 5A through 5E are sectional views showing the third preferred embodiment of a process for producing a TFT according to the present invention.

First, as shown in FIG. 5A, a polycrystalline silicon film 20 having a predetermined shape is formed on an insulating substrate 1 as an active layer. The material, forming method and thickness of the polycrystalline silicon film 20 are the same as those in the preceding preferred embodiments.

Figure 5B:
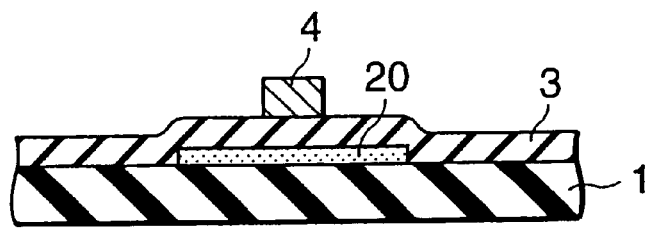

Then, as shown in FIG. 5B, after a gate insulator film 3 is formed on the whole surface, a gate electrode 4 is formed on the gate insulator film 3. The materials, forming methods and thicknesses of the gate insulator film 3 and the gate electrode 4 are the same as those in the preceding preferred embodiments.

Figure 5C:
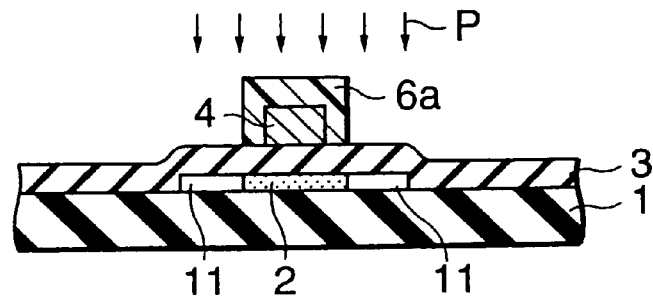

Then, as shown in FIG. 5C, while the gate electrode 4 and the vicinity thereof are covered with a photo-resist 6a to be offset, phosphorus (P) serving as an n-type: impurity is ion-implanted to form two intermediate-concentration n*-type source-drain regions 11. The n*-type source-drain regions 11 have an impurity concentration profile having a substantially flat distribution, which has an average impurity concentration of $1 \times 10^{19}$ cm$^{-3}$ and a maximum value in the vicinity of the center in the depth direction as shown in FIG. 2A.

Figure 5D:
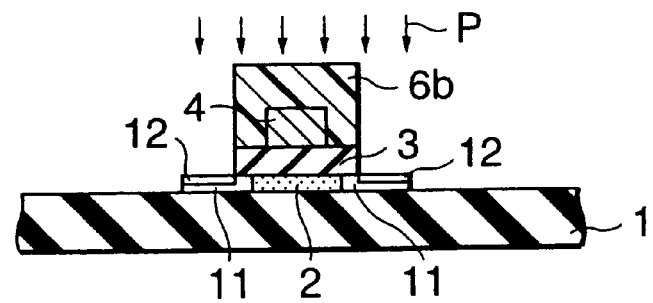

Then, as shown in FIG. 5D, after the resist 6a is removed, the gate insulator film is etched while the gate electrode 4 and the n*-type source-drain regions 11 in the vicinity thereof are covered with a photo-resist 6b. Subsequently, after the resist 6b is removed, ion implantation carried out while no insulator film is formed above an n⁺ region, which will be formed later. In this case, since it is possible to remove the loss due to the dopant absorbed into the insulator film, it is possible to shorten the processing time for ion implantation. Fox example, it is assumed that the impurity concentration of an n+ region 12 to be formed is $1 \times 10^{20}$ cm$^{-3}$. In this case, since no insulator film 3 is formed on the upper layer of the n⁺ region 12, the peak concentration for ion implantation exists in the vicinity of the surface of the n⁺ region 12. Therefore, it is possible to form high-concentration n⁺-type source-drain regions 12 only in the upper portion. Phosphorus (P) serving as an n-type impurity is ion-implanted into the polycrystalline silicon film 20 to form two high-concentration n⁺-type source-drain regions 12 in the vicinity of the surface.

Figure 3C:
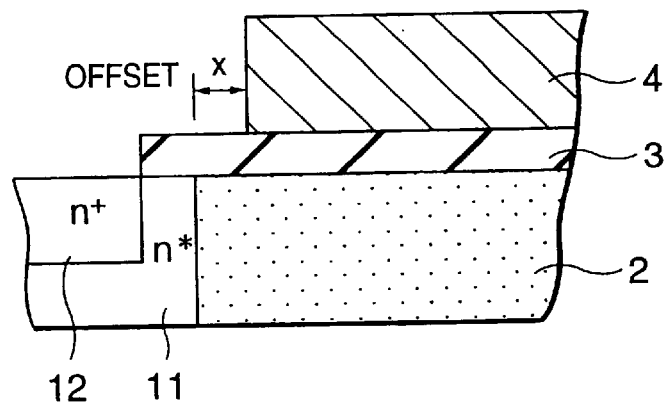

As a result, as shown in FIG. 3C, the intermediate-concentration n*-type source-drain regions 11 are formed on the outside of the active layer 2 viewed from the gate electrode 4. Moreover, on the outside of the intermediate-concentration n*-type source-drain regions 11, the high-concentration n⁺-type source-drain regions 12 are formed in the upper layer, and the intermediate-concentration n*-type source-drain regions 11 are formed in the bottom. Furthermore, the junction surface between the active layer 2 and the n* region 11 is offset from the end portion of the gate electrode 4.

Then, the impurity (P) is activated by an energy beam, such as a laser light or an electron beam, (a laser annealing) or thermally activated at a low temperature of lower than or equal to 600° C. (a thermal annealing at a temperature of lower than or equal to 600° C.).

Figure 5E:
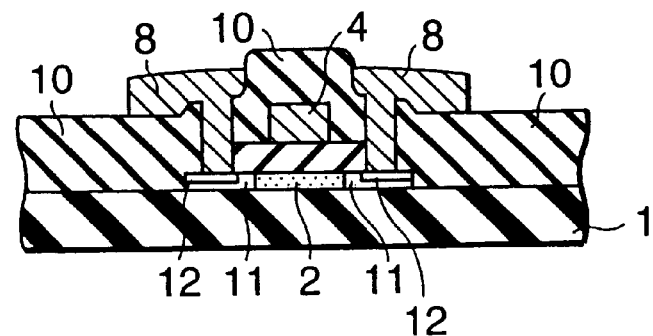

Then, as shown in FIG. 5E, after an interlayer insulator film 10 is formed on the whole surface, the gate insulator film 3 on the n⁺-type source-drain regions 12 and the interlayer insulator film 10 are etched to form contact holes to the n⁺-type source-drain regions 12. Finally, after a conductive film is formed on the whole surface, the conductive film is etched to form a source-drain electrode 8 to accomplish the basic structure of a coplanar type TFT.

Furthermore, an offset amount x (see FIG. 3C) from the end of the gate electrode of the n* region can cause the end of the n⁺ region 12 to approach the end of the gate electrode 4 since the resistance of the active layer 2 is higher than that in the case where the n⁻ LDD region is provided. Usually, the resistance of the n⁻ LDD region is less than or equal to 100 kΩ, and the resistance of the n* region 11 is lower than or equal to one-tenth of that of the n⁻ LDD region (lower than or equal to 10 kΩ). However, since the resistance of the active layer 2 is higher than or equal to one-hundredth of that of the n⁻ LDD region (higher than or equal to 10 MΩ), the n* region 11 may be extended to the gate end.

In this preferred embodiment, the number of steps is reduced, so that it is possible to obtain the following advantages in addition to the same advantages as those in the second preferred embodiment.

That is, the active layer 2 having a good crystallinity is connected directly to the n* region having a high activation rate and a good recovery of crystal by annealing, so that it is possible to obtain a good junction characteristic and a TFT having a small OFF current. Moreover, the n* region 11 is offset, so that it is possible to inhibit the vicinity of the drain from being deteriorated by a high field and it is possible to provide a reliable TFT.

(Fourth Preferred Embodiment)

FIGS. 6A through 6F are sectional views showing a process for producing the fourth preferred embodiment of a TFT according to the present invention. In this preferred embodiment, the TFT is a reverse stagger type TFT.

Figure 6A:
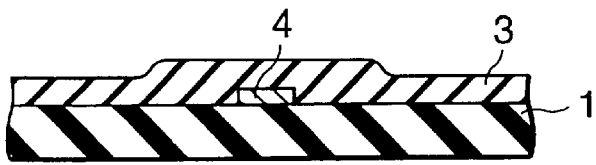
FIGS. 6A through 6F are sectional views showing the fourth preferred embodiment of a process for producing a TFT according to the present invention.

First, as shown in FIG. 6A, after a gate electrode 4 is formed on an insulating substrate 1, a gate insulator film 3 is formed on the whole surface so as to cover the gate electrode 4. The materials, forming methods and thicknesses of the gate insulator film 3 and the gate electrode 4 are the same as those in the preceding preferred embodiments.

Figure 6B:
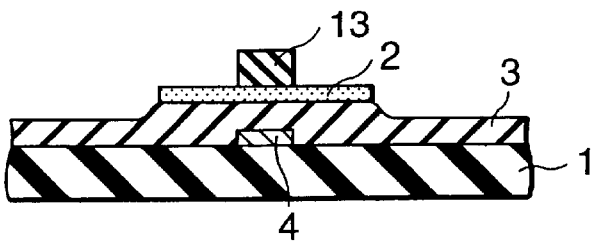

Then, as shown in FIG. 6B, a polycrystalline silicon film 20 having a predetermined shape is formed on the insulating substrate 1 as an active layer. The material, forming method and thickness of the polycrystalline silicon film 20 are the same as those in the preceding preferred embodiments. A silicon nitride film having a thickness of 300 nm is formed thereon by the CVD method to be patterned to form a channel protective film 13.

Figure 6C:
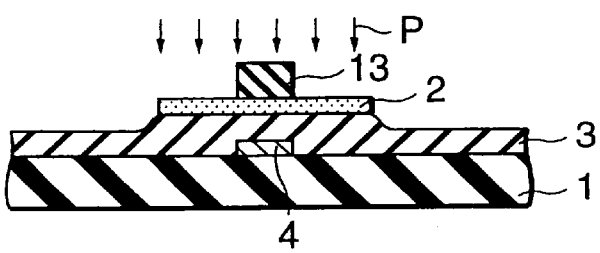

Then, as shown in FIG. 6C, phosphorus (P) serving as an n-type impurity is ion-implanted into the polycrystalline silicon film 20 using the channel protective film 13 as a mask to form two low-concentration n⁻-type source-drain regions 5. The n⁻-source-drain regions 5 have an impurity concentration profile having a substantially flat distribution, which has an average impurity concentration of $5 \times 10^{17}$ cm$^{-3}$ and a maximum value in the vicinity of the center in the depth direction as shown in FIG. 2A.

Figure 6D:
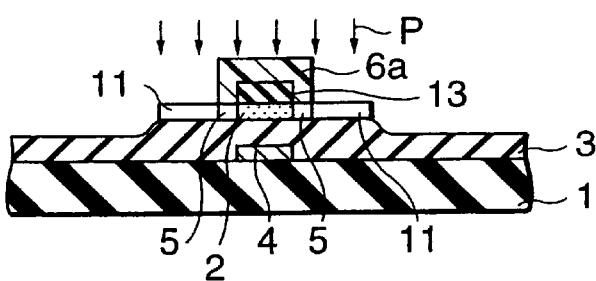

Then, as shown in FIG. 6D, while the channel protective film 13 and the n⁻-type source-drain region in the vicinity thereof are covered with a photo-resist 6a, phosphorus (P) serving as an n-type impurity is ion-implanted into the polycrystalline silicon film 20 to form two intermediate-concentration n*-type source-drain regions 11. The n*-type source-drain regions 11 have an impurity concentration profile having a substantially flat distribution, which has an average impurity concentration of $1 \times 10^{17}$ cm$^{-3}$ and a maximum value in the vicinity of the center in the depth direction as shown in FIG. 2A.

Figure 6E:
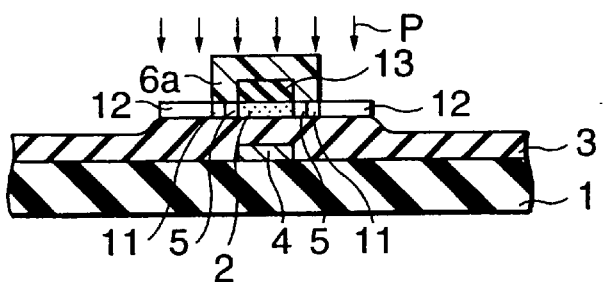

Then, the resist 6a is removed. Thereafter, as shown in FIG. 6E, while the channel protective film 13, the n⁻-type source-drain regions 5 in the vicinity thereof and the n*-type source-drain regions 11 in the vicinity thereof are covered with a photo-resist 6a, phosphorus (P) serving as an n-type impurity is ion-implanted into the polycrystalline silicon film 20 to form two high-concentration n⁺-type source-drain regions 12. The n⁺-type source-drain regions have an impurity concentration profile having a substantially flat distribution, which has an average impurity concentration of $1 \times 10^{20}$ cm$^{-3}$ and a maximum value in the vicinity of the center in the depth direction as shown in FIG. 2A.

As a result, as shown in FIG. 3A, the low-concentration n⁻-type source-drain regions 5, the intermediate-concentration n*-type source-drain regions 11 and the high-concentration n⁺-type source-drain regions 12 are sequentially formed on the outside of the active layer 2.

Then, activation is carried out by the laser annealing or the thermal annealing at a low temperature of lower than or equal to 600° C. Since the laser annealing is completed in a short time, there is no problem in that the impurity concentration profile varies. The thermal annealing at a low temperature is the same. Moreover, even if an inexpensive glass substrate is used as the insulating substrate 1 to reduce costs, there is no problem in that the glass substrate is thermally damaged.

Figure 6F:
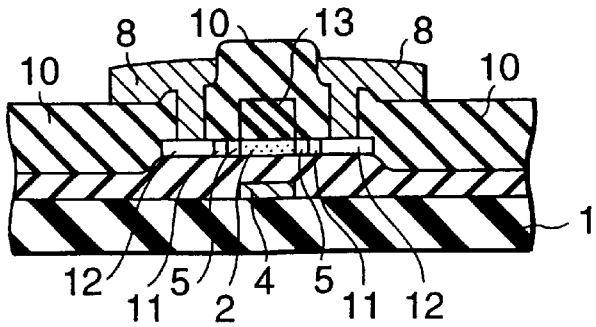
Figure 7A:
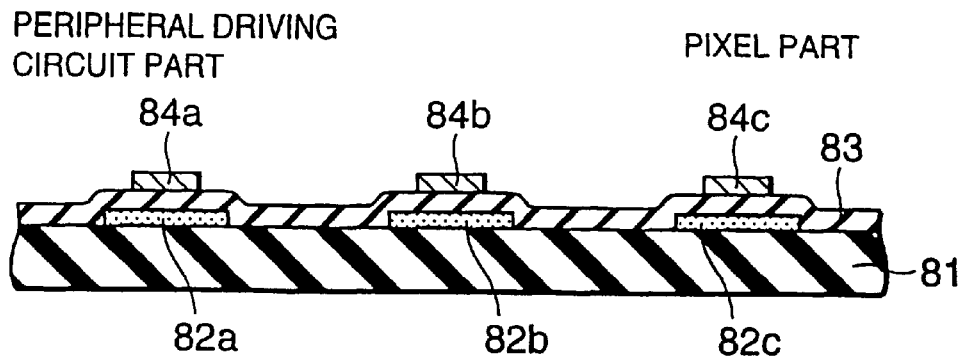
FIGS. 7A through 7E are sectional views showing a process for producing a conventional pixel part-peripheral driving circuit part integrated array substrate for a liquid crystal display.
Figure 7B:
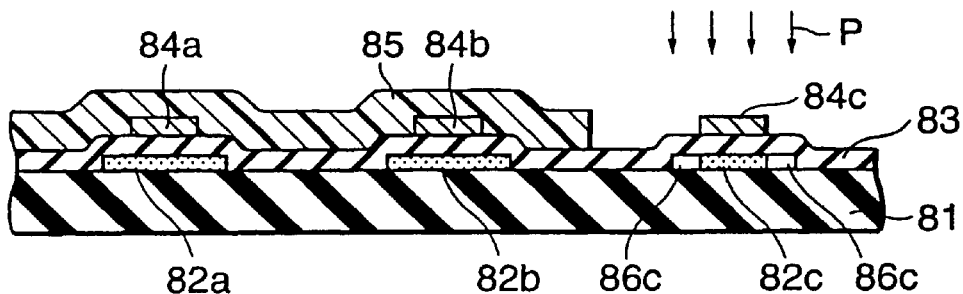
Figure 7C:
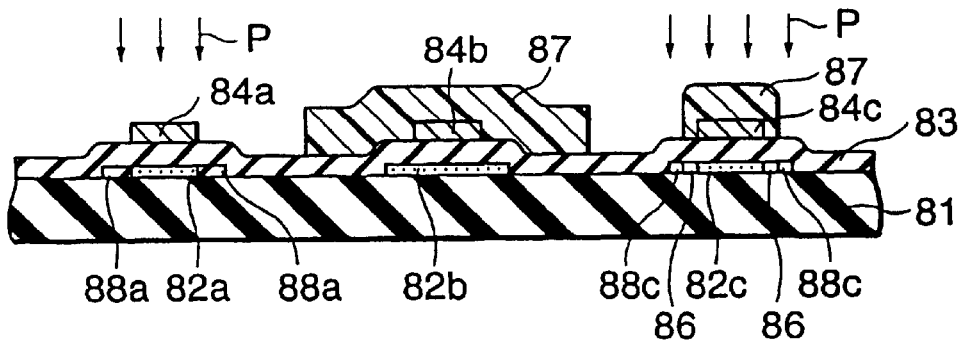
Figure 7D:
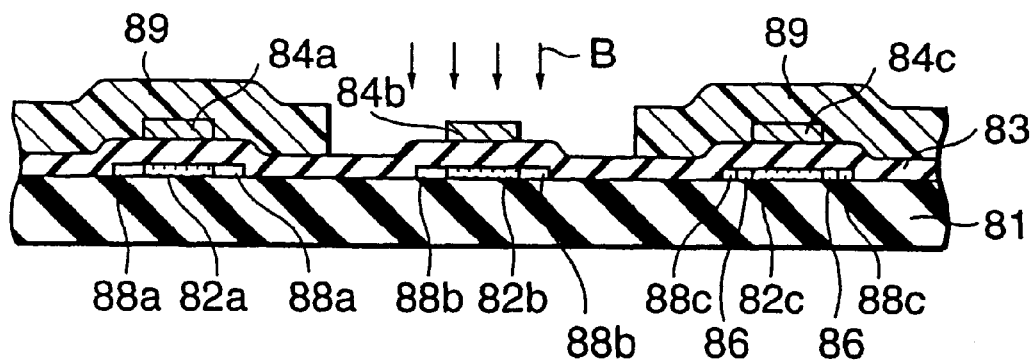
Figure 7E:
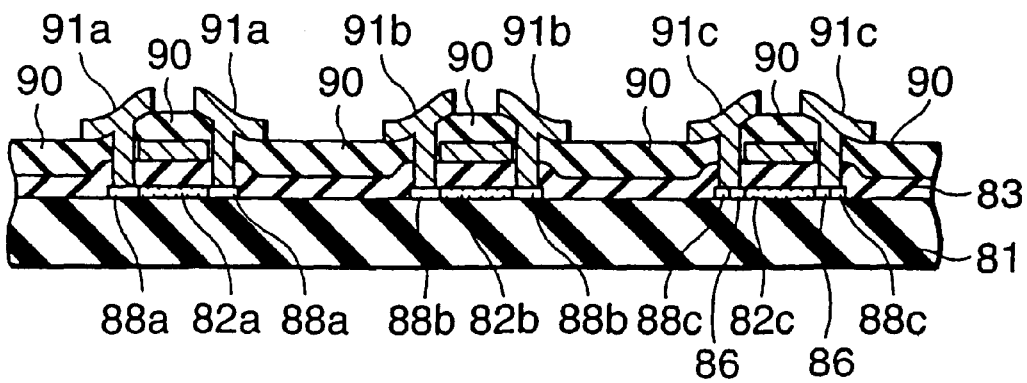

Then, as shown in FIG. 6F, after an interlayer insulator film 10 is formed on the whole surface, the gate insulator film 3 on the n⁺-type source-drain regions 12 and the interlayer insulator film 10 are etched to form contact holes to the n⁺-type source-drain regions 12. Finally, after a conductive film is formed on the whole surface, the conductive film is etched to form a source-drain electrode 8 to accomplish the basic structure of a reverse stagger type TFT.

In this preferred embodiment, it is possible to obtain the following advantages in addition to the same advantages as those in the preceding preferred embodiments. That is, when the array substrate, on which the thin film transistors are formed, faces to a color filter substrate to inject a liquid crystal into a space therebetween to produce a liquid crystal display, the gate electrode shields light in the semiconductor channel layer to allow light to be incident from the bottom of the array substrate. Therefore, the thin film transistors serve to have small light leak, so that it is possible to improve characteristics.

Furthermore, the present invention should not be limited to the above described preferred embodiments. For example, while the coplanar and reverse stagger type TFTs have been described in the above preferred embodiments, the present invention may be applied to a stagger type TFT wherein the orders of the growth of films and patterning are reversed from the reverse stagger type TFT.

Furthermore, while the n channel TFT has been described in the first through fourth preferred embodiments, the present invention may be applied to a p channel TFT.

In the first through fourth preferred embodiments, while the intrinsic active layer has been used, the active layer may include an impurity (e.g., phosphorus or boron) of about $1 \times 10^{17}$ cm$^{-3}$.

Figure 9:
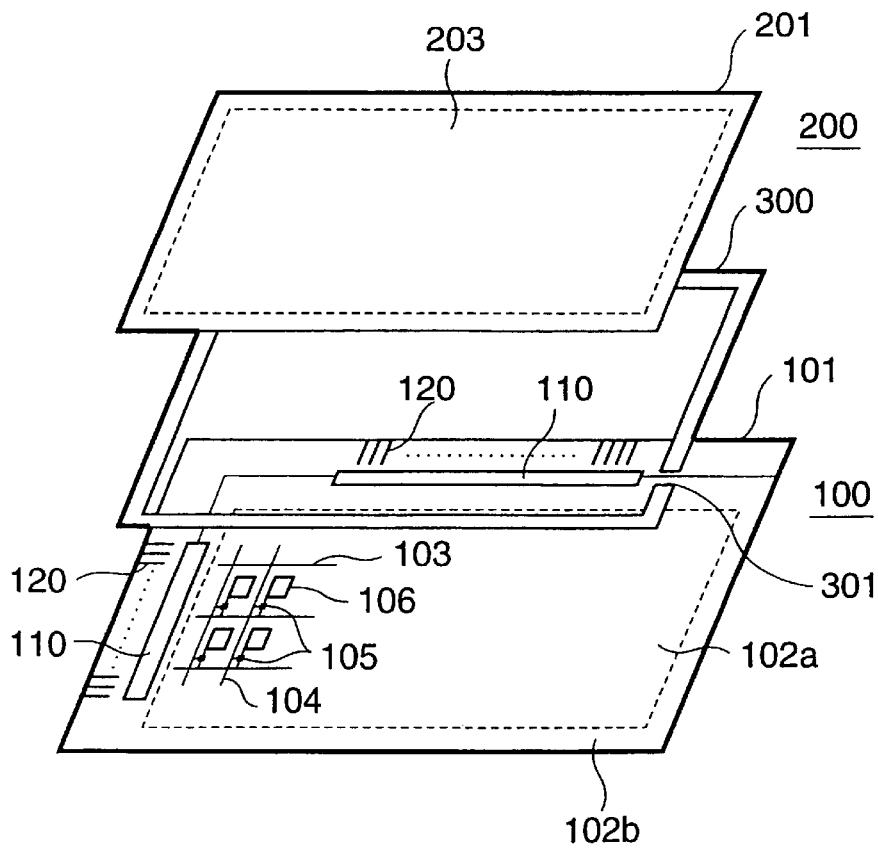
FIG. 9 is a schematic diagram showing an active matrix type liquid crystal display.

Referring to FIG. 9, an active matrix type liquid crystal display using TFTs as pixel switching elements in any one of the first through fourth preferred embodiments will be described below.

This liquid crystal display comprises an array substrate 100 and a counter substrate 200. The array, substrate 100 comprises: a transparent insulating substrate (e.g., a glass substrate) 101; a plurality of signal lines 103 and a plurality of scanning lines 104, which are arranged in the form of a matrix on a display region 102a of the transparent insulating substrate 101; switching elements 105 of TFTs which are formed at the respective points of intersection of the signal lines 103 with the scanning lines 104; and pixel electrodes 106 provided for each of the switching elements 105. The gate of each of the switching elements 105 is connected to the corresponding one of the scanning lines 104. One of the source and drain of each of the switching elements 105 is connected to the corresponding one of the signal lines 103, and the other of each of the switching elements 105 is connected to the corresponding one of the pixel electrodes 106.

On the array substrate 100, driving circuits 110 having TFTs and external terminals 120, which are connected to the driving circuits 110 for supplying power and signals from the outside, are formed in a non-display region 102b in the periphery of the transparent insulating substrate 101.

On the other hand, the counter substrate 200 comprises a transparent insulating substrate 201, and a transparent conductive film of indium thin oxide (ITO) serving as a counter electrode 203 formed on one surface of the transparent insulating substrate 201.

These substrates 100 and 200 face each other so as to keep a predetermined gap therebetween. The substrates 100 and 200 are adhered to each other by a sealing material 300 which is applied on the non-display region 102b so as to surround the display region 102a of the array substrate 100. The sealing material 300 has an inlet 301 for injecting a liquid crystal material as shown in FIG. 9. After the substrates 100 and 200 are adhered to each other, a liquid crystal composition (not shown) is injected into the gap via the inlet 301, and the inlet 301 is sealed to accomplish a liquid crystal display. Furthermore, when the liquid crystal display is a color liquid crystal display, a color filter layer is formed on one of the counter substrate 200 and the array substrate 100.

When the TFTs in any one of the first through fourth preferred embodiments are used as pixel switching elements, it is possible to reduce the OFF current and it is possible to prevent pixels from deteriorating. In addition, the present invention can be embodied in various ways without departing from the principle of the invention.

As described above, according to the present invention, it is possible to provide a reliable thin film transistor, which has an efficient blocking function to minority carriers and a small OFF current by providing n-type source-drain region (n* region) having an intermediate concentration and a high activation rate between a low impurity concentration LDD region and a high impurity concentration n$^+$ source-drain region.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A thin film transistor comprising:

an insulating substrate;

a semiconductor layer of a polycrystalline silicon formed on said insulating substrate;

a gate insulator film formed so as to contact said semiconductor layer;

a gate electrode formed so as to contact said gate insulator film;

an active layer formed in a region of said semiconductor layer corresponding to said gate electrode;

a first semiconductor region which is formed in said semiconductor layer outside of said active layer which has an impurity concentration of higher than or equal to $1 \times 10^{18}$ cm$^{-3}$ and lower than $1 \times 10^{20}$ cm$^{-3}$; and a second semiconductor region which is formed in said semiconductor layer outside of said first semiconductor region and which has an impurity concentration of higher than that of said first semiconductor region, said second semiconductor region having the same conductive type as that of said first semiconductor region, wherein said first semiconductor region is formed between said second semiconductor region and said insulating substrate.

2. A thin film transistor as set forth in claim 1, wherein said impurity concentration of said second semiconductor region is higher than or equal to $1 \times 10^{20}$ cm$^{-3}$ and lower than or equal to $1 \times 10^{22}$ cm$^{-3}$.

3. A thin film transistor as set forth in claim 1, wherein a boundary surface between said active layer and said first semiconductor region is offset from an end of said gate electrode.

4. A thin film transistor as set forth in claim 1, wherein said first semiconductor region has a width of more than or equal to 0.2 $\mu$m and less than or equal to 2 $\mu$m.

5. A thin film transistor as set forth in claim 1, wherein said active layer has a thickness of from 10 to 100 nm.

6. A thin film transistor comprising:

an insulating substrate;

a semiconductor layer of a polycrystalline silicon formed on said insulating substrate;

a gate insulator film formed so as to contact said semiconductor layer;

a gate electrode formed so as to contact said gate insulator film;

an active layer formed in a region of said semiconductor layer corresponding to said gate electrode;

a first semiconductor region which is formed in said semiconductor layer outside of said active layer and which has an impurity concentration of higher than or equal to $1 \times 10^{18}$ cm$^{-3}$ and lower than $1 \times 10^{20}$ cm$^{-3}$;

a second semiconductor region which is formed in said semiconductor layer outside of said first semiconductor region and which has an impurity concentration of higher than that of said first semiconductor region, said second semiconductor region having the same conductive type as that of said first semiconductor region; and a third semiconductor region which is formed in said semiconductor layer between said active layer and said first semiconductor region and which has an impurity concentration of lower than that of said first semiconductor region, said third semiconductor region having the same conductive type as that of said first semiconductor region.

7. A thin film transistor as set forth in claim 6, wherein said first semiconductor region has n-type impurities activated a temperature lower than or equal to 600° C.

8. A thin film transistor as set forth in claim 6, wherein said first semiconductor region is formed between said second semiconductor region and said insulating substrate.

9. A thin film transistor as set forth in claim 6, wherein said impurity concentration of said second semiconductor region is higher than or equal to $1\times10^{20}$ cm$^{-3}$ and lower than or equal to $1\times10^{22}$ cm$^{-3}$, and said impurity concentration of said third semiconductor region is higher than or equal to $1\times10^{16}$ cm$^{-3}$ and lower than $1\times10^{18}$ cm$^{-3}$.

10. A thin film transistor as set forth in claim 6, wherein said semiconductor layer is formed between said insulating substrate and said gate insulating film.

11. A thin film transistor as set forth in claim 6, wherein said gate electrode is formed between said insulating substrate and said gate insulating film.

12. A thin film transistor as set forth in claim 6, wherein said first semiconductor region has a width of more than or equal to 0.2 μm and less than or equal to 2 μm.

13. A thin film transistor as set forth in claim 6, wherein said active layer has a thickness of from 10 to 100 nm.

14. A thin film transistor comprising:

an insulating substrate;

a semiconductor layer of a polycrystalline silicon formed on said insulating substrate;

a gate insulator film formed so as to contact said semiconductor layer;

a gate electrode formed so as to contact said gate insulator film;

an active layer formed in a region of said semiconductor layer corresponding to said gate electrode;

a first semiconductor region which is formed in said semiconductor layer outside of said active layer which has an impurity concentration of higher than or equal to $1\times10^{18}$ cm$^{-3}$ and lower than $1\times10^{20}$ cm$^{-3}$; and a second semiconductor region which is formed in said semiconductor layer outside of said first semiconductor region and which has an impurity concentration of higher than that of said first semiconductor region, said second semiconductor region having the same conductive type as that of said first semiconductor region, wherein said first semiconductor region has n-type impurities activated at a temperature of lower than or equal to 600° C., and wherein said first semiconductor region is formed between said second semiconductor region and said insulating substrate.

15. A thin film transistor as set forth in claim 14, wherein said impurity concentration of said second semiconductor region is higher than or equal to $1\times10^{20}$ cm$^{-3}$ and lower than or equal to $1\times10^{22}$ cm$^{-3}$.

16. A thin film transistor as set forth in claim 14, wherein a boundary surface between said active layer and said first semiconductor region is offset from an end of said gate electrode.

17. A thin film transistor as set forth in claim 14, wherein said first semiconductor region has a width of more than or equal to 0.2 μm and less than or equal to 2 μm.

18. A thin film transistor as set forth in claim 14, wherein said active layer has a thickness of from 10 to 100 nm.

* * * * *